US010283556B2

(12) United States Patent
Yamazaki

(10) Patent No.: US 10,283,556 B2
(45) Date of Patent: May 7, 2019

(54) PHOTOELECTRIC CONVERSION DEVICE, IMAGE PICKUP SYSTEM, AND DRIVING METHOD OF THE PHOTOELECTRIC CONVERSION DEVICE

(71) Applicant: CANON KABUSHIKI KAISHA, Tokyo (JP)

(72) Inventor: Yoshikazu Yamazaki, Sagamihara (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 15/452,462

(22) Filed: Mar. 7, 2017

(65) Prior Publication Data

US 2017/0179188 A1 Jun. 22, 2017

Related U.S. Application Data

(63) Continuation of application No. 14/687,654, filed on Apr. 15, 2015, now Pat. No. 9,627,425.

(30) Foreign Application Priority Data

Apr. 18, 2014 (JP) .................................. 2014-086685

(51) Int. Cl.
*H01L 27/146* (2006.01)
*H04N 5/32* (2006.01)

(52) U.S. Cl.
CPC .. *H01L 27/14663* (2013.01); *H01L 27/14623* (2013.01); *H04N 5/32* (2013.01)

(58) Field of Classification Search
CPC ........ H01L 27/14663; H01L 27/14623; H04N 5/32

USPC ........ 348/294–324; 250/208.1; 257/290–292
See application file for complete search history.

(56) References Cited

U.S. PATENT DOCUMENTS

| | | | |
|---|---|---|---|
| 5,521,639 A | 5/1996 | Tomura | |
| 2002/0018133 A1 | 2/2002 | Mendis | |
| 2004/0262492 A1 | 12/2004 | Matsuda | |
| 2005/0128326 A1 | 6/2005 | Korthout | |
| 2005/0139774 A1 | 6/2005 | Ikegawa | |
| 2006/0007331 A1 | 1/2006 | Izumi | |
| 2006/0169871 A1* | 8/2006 | Kochi | H01L 27/14601 250/208.1 |
| 2009/0066793 A1* | 3/2009 | Takeda | H04N 17/002 348/148 |
| 2011/0032391 A1* | 2/2011 | Cheung | H04N 5/2176 348/241 |

(Continued)

FOREIGN PATENT DOCUMENTS

| | | |
|---|---|---|
| CN | 101262553 A | 9/2008 |
| CN | 101841666 A | 9/2010 |
| CN | 102196199 A | 9/2011 |

(Continued)

*Primary Examiner* — Yogesh K Aggarwal
(74) *Attorney, Agent, or Firm* — Canon U.S.A., Inc. IP Division

(57) ABSTRACT

A photoelectric conversion device has a pixel area including an effective pixel row and a reference pixel row, the reference pixel row containing a plurality of reference pixel pairs, each pair composed of a first reference pixel and a second reference pixel arranged adjacent to each other. The first and second reference pixels output reference signals having different signal levels and independent of the quantity of incident light.

21 Claims, 6 Drawing Sheets

(56) References Cited

U.S. PATENT DOCUMENTS

2012/0193542 A1\* 8/2012 Yamada .................. H04N 5/32
250/366
2012/0200842 A1\* 8/2012 Kamiyama .......... G01B 11/026
356/5.03

FOREIGN PATENT DOCUMENTS

| CN | 102209212 A | 10/2011 |
|---|---|---|
| CN | 102256068 A | 11/2011 |
| CN | 103369259 A | 10/2013 |
| CN | 103681720 A | 3/2014 |
| EP | 1143706 A2 | 10/2001 |
| JP | 2006-013988 A | 1/2006 |
| JP | 2011-091492 A | 5/2011 |
| JP | 2013-175859 A | 9/2013 |
| WO | 2006/120815 A1 | 11/2006 |

\* cited by examiner

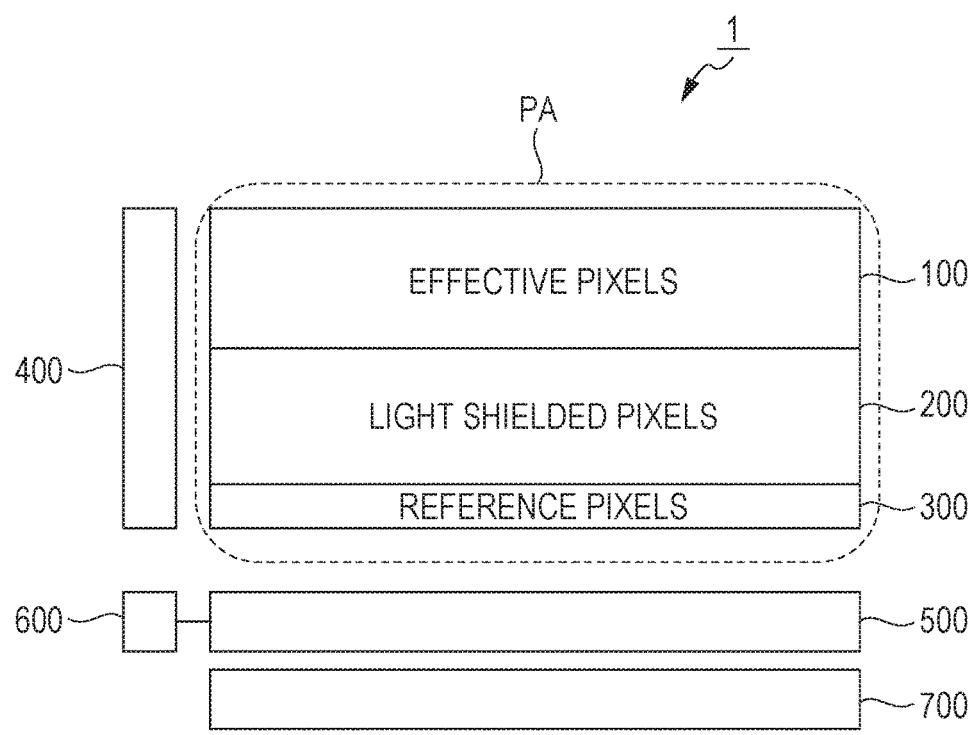

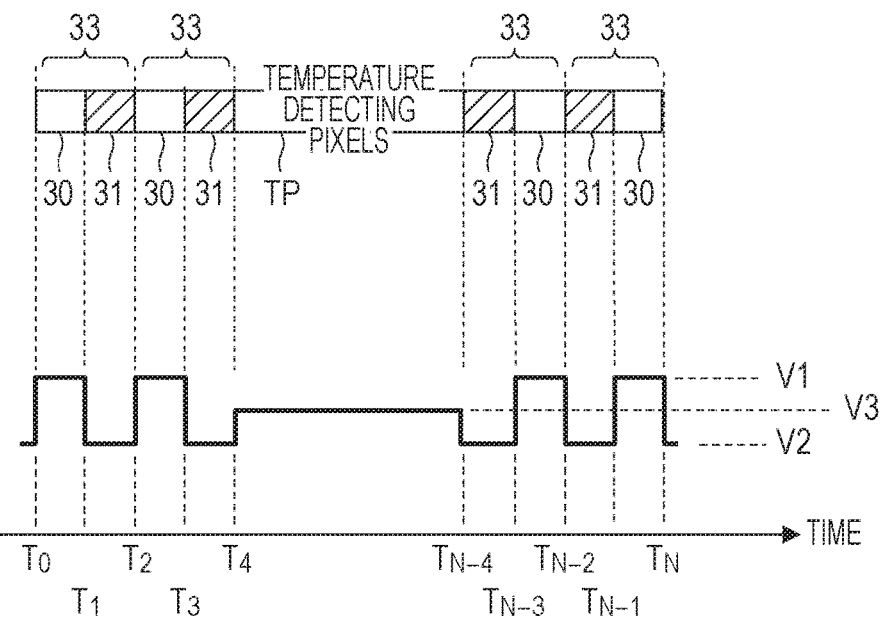

PHOTOELECTRIC CONVERSION DEVICE, IMAGE PICKUP SYSTEM, AND DRIVING METHOD OF THE PHOTOELECTRIC CONVERSION DEVICE

CROSS-REFERENCE TO RELATED APPLICATION

This application is a Continuation of U.S. application Ser. No. 14/687,654, filed Apr. 15, 2015, which claims priority from Japanese Patent Application No. 2014-086685 filed Apr. 18, 2014, which are hereby incorporated by reference herein in their entireties.

BACKGROUND OF THE INVENTION

Field of the Invention

The present invention relates to a photoelectric conversion device, and particularly relates to a photoelectric conversion device that outputs a reference signal.

Description of the Related Art

In the field of image pickup apparatuses, a signal serving as a reference for timing of an operation, such as correction, is known to be generated by an image pickup apparatus itself. Japanese Patent Laid-Open No. 5-308579 describes a technique in which an optical black region containing light shielded pixels includes position reference pixels that generate output signals different from those generated by the light shielded pixels. Also, Japanese Patent Laid-Open No. 5-308579 mentions that one position reference pixel is surrounded by light shielded pixels.

In a solid-state imaging apparatus described in Japanese Patent Laid-Open No. 5-308579, the output of position reference pixels may vary depending on, for example, the temperature, the use environment, or the length of storage time of the solid-state imaging apparatus. In particular, since one position reference pixel in the optical black region is surrounded by light shielded pixels, it is difficult to identify whether the read signal is based on the position reference pixel or is a specific signal generated by a defective light shielded pixel or the like. Also, since one position reference pixel is surrounded by light shielded pixels, a complex process is required to identify the start position of a row from read signals.

SUMMARY OF THE INVENTION

Techniques to be described below solve at least one of the problems described above.

A photoelectric conversion device according to an aspect of the present invention has a pixel area including an effective pixel row and a reference pixel row, the reference pixel row containing a plurality of reference pixel pairs, each pair composed of a first reference pixel and a second reference pixel arranged adjacent to each other. The first reference pixel outputs a first reference signal independent of the quantity of incident light. The second reference pixel outputs a second reference signal having a signal level different from a signal level of the first reference signal. The second reference signal is also independent of the quantity of incident light.

A driving method of a photoelectric conversion device according to another aspect of the present invention is a driving method of a photoelectric conversion device having a pixel area including an effective pixel row and a reference pixel row, the reference pixel row containing a plurality of reference pixel pairs and a light shielded pixel, each pair composed of a first reference pixel and a second reference pixel arranged adjacent to each other, wherein the first reference pixel outputs a first reference signal independent of the quantity of incident light, and the second reference pixel outputs a second reference signal having a signal level different from a signal level of the first reference signal, the second reference signal being independent of the quantity of incident light. The driving method includes outputting a signal from each of the first reference pixel and the second reference pixel included in one of the pairs before the light shielded pixel outputs a signal.

Further features of the present invention will become apparent from the following description of exemplary embodiments with reference to the attached drawings.

BRIEF DESCRIPTION OF THE DRAWINGS

FIG. 1 illustrates a configuration of a photoelectric conversion device.

FIG. 4A illustrates a configuration of a reference pixel row and FIG. 4B illustrates a signal output from the output unit according to a second embodiment.

DESCRIPTION OF THE EMBODIMENTS

First Embodiment

Figure 2A:
FIG. 2A illustrates a configuration of a reference pixel row and FIG. 2B illustrates a signal output from an output unit according to a first embodiment.

FIG. 1 illustrates a configuration of a photoelectric conversion device according to a first embodiment. A photoelectric conversion device 1 includes a pixel area PA, a row selecting unit 400, a reading unit 500, an output unit 600, and a horizontal scanning unit 700.

The pixel area PA includes an effective pixel region 100, a light shielded pixel region 200, and a reference pixel region 300. The effective pixel region 100 includes an effective pixel row containing a plurality of effective pixels, each including a photoelectric converter and configured to output a signal in accordance with incident light. The light shielded pixel region 200 includes a light shielded pixel row containing a plurality of light shielded pixels, each including a photoelectric converter shielded from light.

When the row selecting unit 400 selects a row in the pixel area PA, pixel signals are output from pixels in the selected row. In conjunction with the horizontal scanning unit 700, the reading unit 500 multiplexes signals output in parallel from the pixel area PA, and outputs the multiplexed signal from the output unit 600. The reading unit 500 may include a circuit that buffers signals output from the pixel area PA, and a sample-and-hold circuit that samples and holds signals output from the pixel area PA.

FIG. 2A illustrates a configuration of a reference pixel row included in the reference pixel region 300. A reference pixel row of the present embodiment contains a plurality of reference pixel pairs 33, each composed of a first reference pixel 30 and a second reference pixel 31 arranged adjacent to each other. In the present embodiment, the reference pixel pairs 33 are disposed at both ends of the reference pixel row.

The first reference pixel 30 and the second reference pixel 31 in each of the reference pixel pairs 33 at both ends are arranged in this order from the corresponding end. A first reference signal output from the first reference pixel 30 and a second reference signal output from the second reference pixel 31 have different signal levels. Both the first and second reference signals are independent of the quantity of light incident on the photoelectric conversion device 1. The reference pixel row may contain not only the reference pixel pairs 33, but also other pixels. FIG. 2A illustrates an example where the reference pixel row contains light shielded pixels in a region except a region of four pixels at each end of the reference pixel row.

Figure 2B:
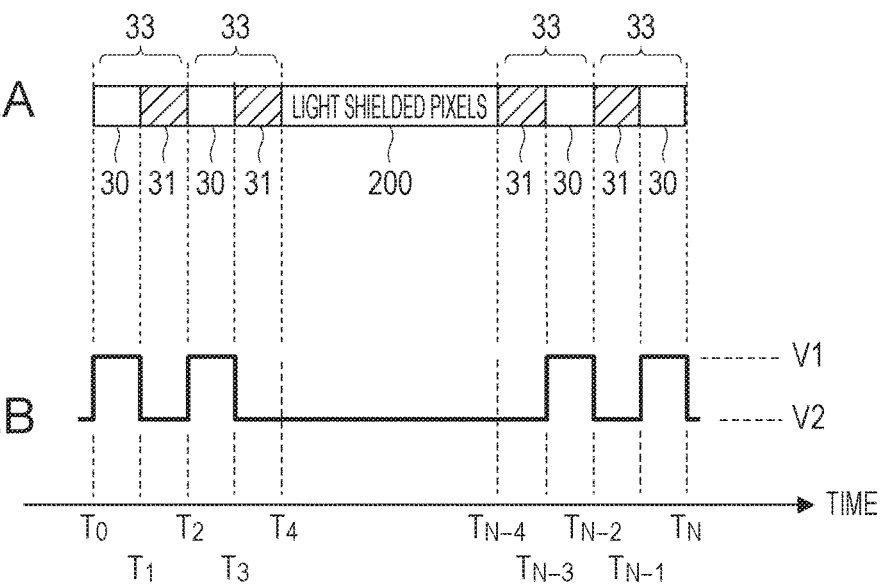

FIG. 2B shows a transition of the value of a signal output from the output unit 600 when signals of a reference pixel row are read. Here, a description will be given of the case where signals are sequentially read from the left-hand side of FIG. 2A. In the period from time $T_0$ to time $T_4$ in FIG. 2B, the first reference signal having an output level V1 and the second reference signal having an output level V2 are alternately output twice each. In the period from time $T_4$ to time $T_{N-4}$, a signal based on the light shielded pixels 200 is output. Then, in the period from time $T_{N-4}$ to time $T_N$, the second reference signal and the first reference signal are alternately output twice each. The output level V2 of the second reference signal may be substantially the same as the level of the signal output from the light shielded pixels 200 as shown in FIG. 2B, or may be different from the level of the signal output from the light shielded pixels 200. Here, the "substantially the same" level means that even if there is a difference in signal level, the difference is within a negligible range. The range of the "substantially the same" level varies depending on the application of the photoelectric conversion device 1 or the specifications to be met.

When a reference pixel row contains a plurality of reference pixel pairs 33 as described above, a transition from a first reference level to a second reference level or a transition from a second reference level to a first reference level appears multiple times in a signal output from the reference pixel row. This facilitates identification of a signal based on a reference pixel. In particular, when a plurality of reference pixel pairs 33 are arranged adjacent to each other, an output pattern is obtained in which the first and second reference signals alternately appear. This makes it possible to accurately distinguish a signal based on a reference pixel from an accidentally generated signal based on a defect in the light shielded pixels 200. Even when, for example, a light shielded pixel, instead of a reference pixel, is disposed at a physical end of a reference pixel row, the beginning of the reference pixel row can be identified by first selecting a reference pixel pair 33 in scanning of the reference pixel row. In other words, each of a first reference pixel and a second reference pixel included in a reference pixel pair 33 outputs a signal before a light shielded pixel contained in the reference pixel row outputs a signal.

The photoelectric conversion device 1 may perform scanning not only in one direction of the pixel area PA, but also in the opposite direction thereof. By providing a reference pixel pair 33 at an end of a reference pixel row, that is, at the scanning start position, the start position of the pixel row being read can be identified. Additionally, in the present embodiment, the first and second reference pixels 30 and 31 of the reference pixel pair 33 disposed at each end of a reference pixel row are arranged in this order from the corresponding end. Thus, the start of the pixel row can be accurately identified even when the direction of scanning is changed. In particular, if a configuration is made such that the output unit 600 outputs a signal level equivalent to that of the second reference signal when no pixel is selected or after one row is read, a signal level equivalent to that of the second reference signal is always output before a signal is read from a reference pixel row. Therefore, by first selecting the first reference pixel 30 in a reference pixel row, the start of the pixel row can be more easily identified.

Figure 3A:
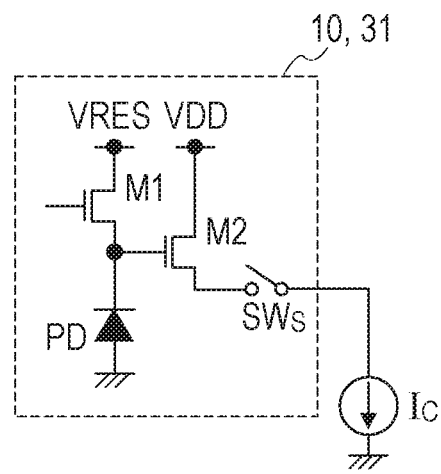
FIG. 3A illustrates a configuration of an effective pixel and FIG. 3B illustrates a configuration of a first reference pixel according to the first embodiment.

FIG. 3A illustrates a configuration of an effective pixel 10 in the effective pixel region 100. The effective pixel 10 includes a photoelectric converter PD, transistors M1 and M2, and a switch $SW_S$. The photoelectric converter PD is, for example, a photodiode. When the switch $SW_S$ is turned on, the transistor M2 operates as a source follower circuit in conjunction with a current source Ic. A control node of the transistor M2 is connected to a node common to both the photoelectric converter PD and one of main nodes of the transistor M1. Then a voltage corresponding to the potential of this node appears at an output node of the source follower circuit. The potential of the control node of the transistor M2 varies with electric charge generated in the photoelectric converter PD. The transistor M1 resets the control node of the transistor M2 and the photoelectric converter PD in accordance with a voltage VRES. The current source Ic may be common to the effective pixel 10 and other pixels including a light shielded pixel. The second reference pixel 31 may have the same configuration as that of the effective pixel 10. In the case of the second reference pixel 31, by keeping the transistor M1 in the on-state at least during the signal reading period, the potential of the control node of the transistor M2 is fixed and the second reference signal independent of the quantity of incident light is output.

Figure 3B:
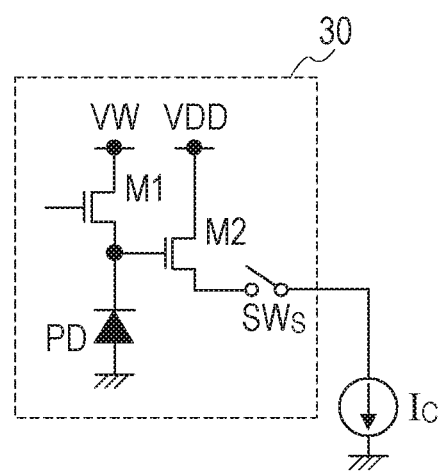

FIG. 3B illustrates a configuration of the first reference pixel 30. The first reference pixel 30 has a configuration similar to that of the effective pixel 10, but differs from the effective pixel 10 in that a voltage supplied to the transistor M1 is VW. The first and second reference pixels 30 and 31 may be configured such that the photoelectric converter PD is shielded from light, or may even have no photoelectric converter. In the first reference pixel 30, again, by keeping the transistor M1 in the on-state at least during the signal reading period, the potential of the control node of the transistor M2 is fixed and the first reference signal independent of the quantity of incident light is output.

As described above, the photoelectric conversion device 1 of the present embodiment includes a reference pixel row, which contains a plurality of reference pixel pairs 33. This improves the accuracy of operation of the photoelectric conversion device 1. Also, a reference pixel pair 33 is disposed at an end of a reference pixel row, that is, at a scanning start position. This allows identification of the start position of the pixel row being read.

Second Embodiment

FIG. 4A illustrates a configuration of a reference pixel row according to a second embodiment of the present invention. A difference from the reference pixel row illustrated in FIG. 2A is that the reference pixel row illustrated in FIG. 4A contains temperature detecting pixels TP instead of the light shielded pixels 200. The temperature detecting pixels TP output signals having a signal level that corresponds to the temperature of the photoelectric conversion device 1.

FIG. 4B shows a transition of the value of a signal output from the output unit 600 when signals of a reference pixel row are read. Here, a description will be given of the case where signals are sequentially read from the left-hand side of FIG. 4A. As in the first embodiment, in the period from time $T_0$ to time $T_4$, the first reference signal having an output level V1 and the second reference signal having an output level V2 are alternately output twice each. In the period from time $T_4$ to time $T_{N-4}$, a signal based on the temperature detecting pixels TP is output. Then, in the period from time $T_{N-4}$ to time $T_N$, the second reference signal and the first reference signal are alternately output twice each. As in the first embodiment, the output level V2 of the second reference signal may be substantially the same as that of the signal output from the light shielded pixels 200. An output level V3 of the signal output from the temperature detecting pixels TP varies with the temperature of the photoelectric conversion device 1.

With the temperature detecting pixels TP of the present embodiment, a signal correction can be made in accordance with the temperature of the photoelectric conversion device 1.

The present embodiment can achieve effects similar to those of the first embodiment.

Third Embodiment

Figure 5:
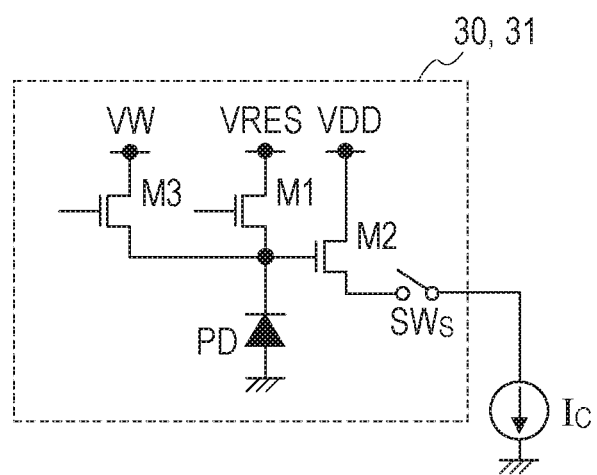
FIG. 5 illustrates a configuration of a reference pixel according to a third embodiment.

FIG. 5 illustrates a configuration of the first and second reference pixels 30 and 31 according to a third embodiment of the present invention. In the present embodiment, the first and second reference pixels 30 and 31 have the same circuit configuration.

The reference pixels according to the present embodiment are configured to be capable of switching an output between the first reference signal and the second reference signal. In the embodiments described above, the control node of the transistor M2 of each of the first reference pixel 30 and the second reference pixel 31 is configured to be supplied with the voltage VRES via the transistor M1. In the present embodiment, the control node of the transistor M2 is configured to be further supplied with the voltage VW via a transistor M3. The transistor M1 and the transistor M3 are not simultaneously turned on.

Using the reference pixels described above is advantageous in that a pattern of a signal output from a reference pixel row can be changed.

The present embodiment can achieve effects similar to those of the embodiments described above.

Fourth Embodiment

Figure 6:
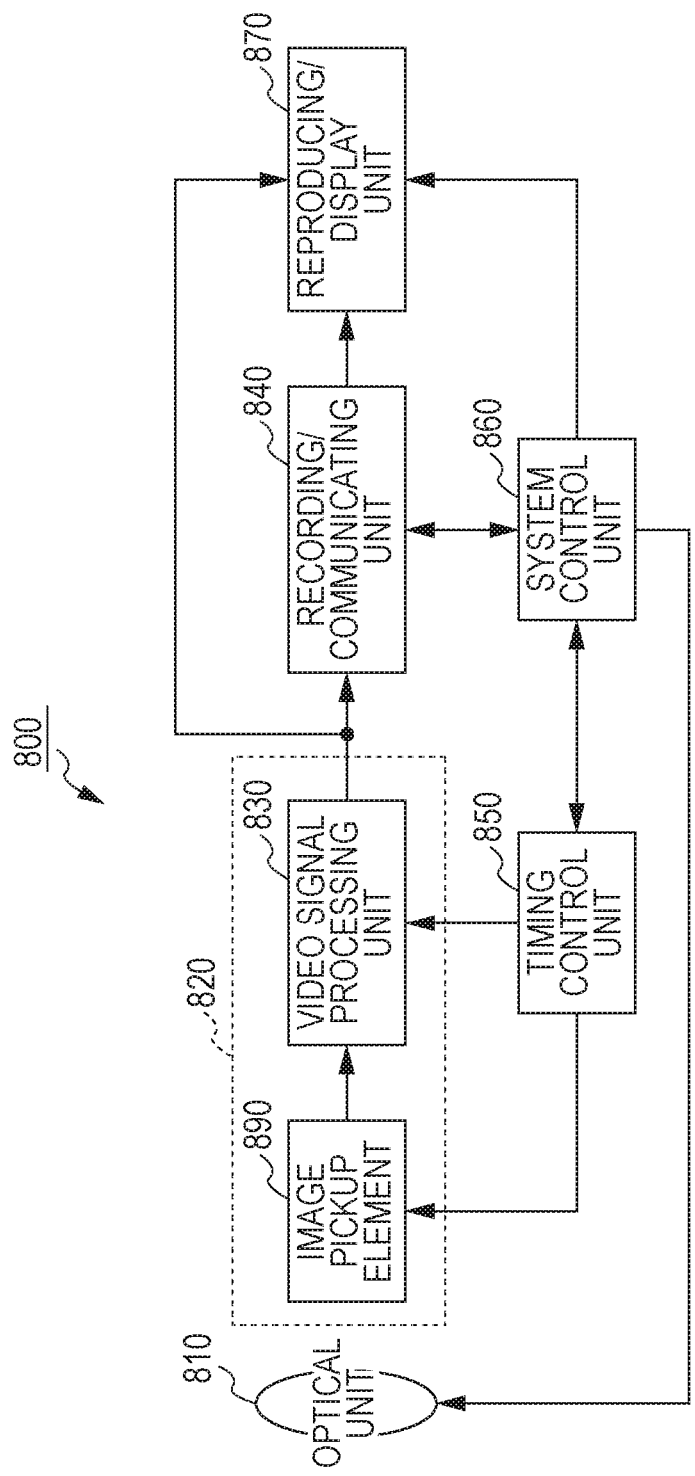
FIG. 6 illustrates a configuration of an image pickup system according to a fourth embodiment.

FIG. 6 illustrates a configuration of an image pickup system according to a fourth embodiment of the present invention. An image pickup system 800 includes, for example, an optical unit 810, an image pickup element 890, a video signal processing unit 830, a recording/communicating unit 840, a timing control unit 850, a system control unit 860, and a reproducing/display unit 870. An image pickup apparatus 820 includes the image pickup element 890 and the video signal processing unit 830. The photoelectric conversion device 1 of the embodiments described above is used as the image pickup element 890.

The optical unit 810, which is an optical system such as a lens, focuses light from an object onto the pixel area PA having a plurality of two-dimensionally arranged pixels in the image pickup element 890 to form an image of the object. In accordance with timing based on a signal from the timing control unit 850, the image pickup element 890 outputs a signal corresponding to the light focused on the pixel area PA. The signal output from the image pickup element 890 is input to the video signal processing unit 830, and processed by the video signal processing unit 830 in accordance with a method defined by a program or the like. A signal obtained by the processing in the video signal processing unit 830 is transmitted as image data to the recording/communicating unit 840. The recording/communicating unit 840 transmits the signal for forming an image to the reproducing/display unit 870 to cause the reproducing/display unit 870 to reproduce a moving image or display a still image. Also, in response to the signal from the video signal processing unit 830, the recording/communicating unit 840 not only communicates with the system control unit 860, but also records the signal for forming an image in a recording medium (not shown).

The system control unit 860 controls an overall operation of the image pickup system 800. The system control unit 860 controls the drive of the optical unit 810, the timing control unit 850, the recording/communicating unit 840, and the reproducing/display unit 870. The system control unit 860 has a storage device (not shown), such as a recording medium, in which a program and the like necessary for controlling the operation of the image pickup system 800 are recorded. The system control unit 860 supplies, into the image pickup system 800, a signal for switching the drive mode in accordance with a user operation or the like. For example, the signal for switching the drive mode is supplied for changing the row to be read or reset, changing the field angle in accordance with an electronic zooming operation, or shifting the field angle in accordance with an electronic image stabilizing operation. The timing control unit 850 controls the drive timing of the image pickup element 890 and the video signal processing unit 830 under control of the system control unit 860.

The image pickup system 800 may include, as the optical unit 810, a wavelength conversion member for converting a wavelength of incident light. Examples of the wavelength conversion member include one that emits visible light upon incidence of X-rays. The image pickup element 890 generates a signal based on incident light having a wavelength converted by the wavelength conversion member. With this configuration, the image pickup system 800 serving as an X-ray imaging apparatus can be provided. The image pickup system 800 may include an X-ray generating device serving as a light source that generates X-rays.

A plurality of semiconductor substrates, each having the photoelectric conversion device 1 thereon, may be two-dimensionally arranged (in other words in a planar configuration) to form a multichip photoelectric conversion apparatus. The photoelectric conversion devices 1 forming the multichip photoelectric conversion apparatus may operate in parallel.

The embodiments described above are for illustrative purposes only, and changes can be made thereto without departing from the principles of the present invention. For example, in the embodiments described above, a reference pixel row contains the light shielded pixels 200 or the temperature detecting pixels TP, as well as the reference pixel pairs 33. However, the reference pixel row may contain only reference pixels.

The present invention makes it possible to achieve at least one of the following: improved accuracy of operation of a photoelectric conversion device, and identification of the start position of a pixel row being read.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

What is claimed is:

1. A photoelectric conversion device comprising:
a first reference pixel and a second reference pixel; and
a voltage supply unit;
wherein each of the first reference pixel and the second reference pixel includes a photoelectric converter and a transistor having a gate,
the voltage supply unit supplies a first voltage to the photoelectric converter of the first reference pixel at a timing,
the voltage supply unit supplies a second voltage to the photoelectric converter of the second reference pixel at the timing, the second voltage being a different voltage from the first voltage,
in the first reference pixel, the first voltage input to the photoelectric converter is supplied to the gate of the transistor,
in the second reference pixel, the second voltage input to the photoelectric converter, is supplied to the gate of the transistor,
the transistor of the first reference pixel outputs a first reference signal having a signal level corresponding to the first voltage, and the transistor of the second reference pixel outputs a second reference signal having a signal level corresponding to the second voltage.

2. The photoelectric conversion device according to claim 1, wherein the transistor is a part of a source follower circuit.

3. The photoelectric conversion device according to claim 2, further comprising a second transistor (M3) connected to the voltage supply unit and the photoelectric converter.

4. The photoelectric conversion device according to claim 3, wherein the photoelectric converter is shielded from light.

5. A multichip photoelectric conversion apparatus formed by two-dimensionally arranging a plurality of semiconductor substrates, each having the photoelectric conversion device according to claim 1.

6. An image pickup system comprising:
the photoelectric conversion device according to claim 1; and
a video signal processing unit configured to process a signal output from the photoelectric conversion device to generate image data.

7. The image pickup system according to claim 6, further comprising a light source configured to generate X-rays.

8. The image pickup system according to claim 7, further comprising a wavelength conversion member configured to convert a wavelength of the X-rays.

9. The photoelectric conversion device according to claim 1, wherein
in a first period including the timing, the voltage supply unit supplies the first voltage to the photoelectric converter of the first reference pixel,
in a second period being the other period from the first period, the voltage supply unit supplies the second voltage to the photoelectric converter of the first reference pixel.

10. The photoelectric conversion device according to claim 9, wherein in a third period between the first period and the second period, the voltage supply unit changes a voltage to be supplied to the photoelectric converter of the first reference pixel, from the first voltage to the second voltage.

11. The photoelectric conversion device according to claim 10, wherein in the first period, the voltage supply unit supplies the second voltage to the photoelectric converter of the second reference pixel, and
in the second period, the voltage supply unit supplies the first voltage to the photoelectric converter of the first reference pixel.

12. The photoelectric conversion device according to claim 11, wherein in the third period, the voltage supply unit changes a voltage to be supplied to the photoelectric converter of the second reference pixel, from the second voltage to the first voltage.

13. The photoelectric conversion device according to claim 12, wherein
the voltage supply unit includes a first switch and a second switch,
in the first period, the first switch supplies the first voltage to the photoelectric converter of the first reference pixel, and the second switch supplies the second voltage to the photoelectric converter of the second reference pixel, and
in the second period, the first switch supplies the first voltage to the photoelectric converter of the second reference pixel, and the second switch supplies the second voltage to the photoelectric converter of the first reference pixel.

14. The photoelectric conversion device according to claim 9, wherein
the voltage supply unit includes a first switch and a second switch,
in the first period, the first switch supplies the first voltage to the photoelectric converter of the first reference pixel, and the second switch supplies the second voltage to the photoelectric converter of the second reference pixel, and
in the second period, the first switch supplies the first voltage to the photoelectric converter of the second reference pixel, and the second switch supplies the second voltage to the photoelectric converter of the first reference pixel.

15. The photoelectric conversion device according to claim 1, wherein
the voltage supply unit includes a first switch and a second switch,
the first switch receives the first voltage from the voltage supply unit, and
the second switch receives the second voltage from the voltage supply unit.

16. A photoelectric conversion device comprising:
a reference pixel;
a voltage supply unit; and
a pixel area having a plurality of pixels arranged in rows and columns, wherein
the reference pixel includes a photoelectric converter and a transistor,
the voltage supply unit supplies a first voltage and a second voltage to the photoelectric converter, the second voltage being a different voltage from the first voltage,
the transistor outputs a first reference signal having a signal level corresponding to the first voltage, and a second reference signal having a signal level corresponding to the second voltage,
the reference pixel includes a second transistor connected to the voltage supply unit and the photoelectric converter,
the photoelectric converter is shielded from light, the pixel area further includes a light shielded pixel including the photoelectric converter shielded from light, and the light shielded pixel outputs a signal corresponding to a potential of the photoelectric converter of the light shielded pixel, and the reference pixel and the light shielded pixel are arranged in the same row.

17. The photoelectric conversion device according to claim 16, wherein the signal level of the second reference signal is closer to a signal level of the signal output from the light shielded pixel than to the signal level of the first reference signal.

18. The photoelectric conversion device according to claim 16, wherein the signal level of the second reference signal is substantially the same as a signal level of the signal output from the light shielded pixel.

19. A photoelectric conversion device comprising:

a reference pixel; and a voltage supply unit; wherein the reference pixel includes a photoelectric converter and a transistor, the voltage supply unit supplies a first voltage and a second voltage to the photoelectric converter, the second voltage being a different voltage from the first voltage, the transistor outputs a first reference signal having a signal level corresponding to the first voltage, and a second reference signal having a signal level corresponding to the second voltage, in a period, the first voltage is supplied from the voltage supply unit to the photoelectric converter, and in the period, the second voltage is not supplied from the voltage supply unit to the photoelectric converter.

20. A photoelectric conversion device comprising:

a reference pixel;

a voltage supply unit, and a pixel area having a plurality of pixels arranged in rows and columns, wherein the reference pixel includes a photoelectric converter and a transistor, the voltage supply unit supplies a first voltage and a second voltage to the photoelectric converter, the second voltage being a different voltage from the first voltage, the transistor outputs a first reference signal having a signal level corresponding to the first voltage, and a second reference signal having a signal level corresponding to the second voltage, the pixel area further includes a first reference pixel and a second reference pixel, each of which is the reference pixel, in a first period, the first voltage is supplied to the photoelectric converter of the first reference pixel, and the second voltage is supplied to the photoelectric converter of the second reference pixel, and in a second period, the second voltage is supplied to the photoelectric converter of the first reference pixel, and the first voltage is supplied to the photoelectric converter of the second reference pixel.

21. The photoelectric conversion device according to claim 20, wherein the reference pixel further includes a second transistor (M1) and a third transistor each connected to the voltage supply unit and the photoelectric converter, the first voltage is supplied from the voltage supply unit to the second transistor, and the second voltage is supplied from the voltage supply unit to the third transistor.

* * * * *